United States Patent [19]

Forrester et al.

[11] Patent Number: 5,793,056
[45] Date of Patent: Aug. 11, 1998

[54] LOW-INDUCTANCE HTS INTERCONNECTS AND JOSEPHSON JUNCTIONS USING SLOT-DEFINED SNS EDGE JUNCTIONS

[75] Inventors: Martin G. Forrester, Pittsburgh; Brian D. Hunt, Murrysville, both of Pa.

[73] Assignee: Northrop Grumman Corporation, Los Angeles, Calif.

[21] Appl. No.: 802,982

[22] Filed: Feb. 21, 1997

[51] Int. Cl.$^6$ .................................................. H01L 29/06
[52] U.S. Cl. ............................ 257/31; 257/33; 257/35; 505/190
[58] Field of Search ............................... 257/30, 31, 32, 257/33, 34, 35; 505/190

[56] References Cited

U.S. PATENT DOCUMENTS 5,304,538  4/1994  Vasquez et al. ..................... 505/190
5,696,392  12/1997  Char et al. ............................ 257/190

Primary Examiner—Sara W. Crane
Assistant Examiner—Douglas A. Wille
Attorney, Agent, or Firm—Walter G. Sutcliff

[57] ABSTRACT

A technique for defining the active area of a high-$T_c$ superconductor Josephson junction uses an epitaxial slotted insulator patterned over the edge of the superconductor thin film-insulator bilayer. The superconductor/normal-metal/superconductor edge junction formed between the slotted insulator has a small active area. The counter electrode provided as an interconnect of the junction can therefore be wider than the active area of the edge junction since it can overlap onto the patterned slotted insulator. The use of the slotted insulator enables fabrication of junctions having resistances and critical currents in the desired range for high-$T_c$ superconductor circuits while enabling the use of wide, low inductance interconnects.

10 Claims, 3 Drawing Sheets

5,793,056

LOW-INDUCTANCE HTS INTERCONNECTS AND JOSEPHSON JUNCTIONS USING SLOT-DEFINED SNS EDGE JUNCTIONS

BACKGROUND OF THE INVENTION

1. Field of the Invention

The present invention relates to an SNS (Superconductor/Normal-metal/Superconductor) edge Josephson junction having an epitaxial slotted insulator patterned over an edge of an HTS (High-$T_c$ Superconductor) thin film-insulator bilayer defining an active area.

2. Description of the Background Art

HTS digital circuits based on single flux quantum (SFQ) logic require small inductance interconnects and junctions so that a single quantized voltage pulse can generate sufficient current in a load inductor. In particular, SFQ designs require inductance-critical current products ($LI_c$) of component superconducting quantum interference devices (SQUIDs) to be on the order of a single flux quantum $\phi_0 = 2000$pH–$\mu$A. However, thermal noise constraints also require that junction critical currents have values approximately 500 $\mu$A at 65°K. These constraints dictate SQUID inductance values of less than 4 pH. Low inductances of approximately 1 pH per square can be achieved in part by incorporating a superconducting ground plane with the SNS junctions that are the building blocks of SFQ circuits. However, many high performance SFQ circuits require even smaller inductance values. Possible approaches for reducing inductances in SFQ circuits include improving the quality of the YBa$_2$Cu$_3$O$_7$(YBCO) superconductor thin films, using thicker ground plane and wiring layers and/or using ground planes both above and below the junction layers. While these approaches may lower inductance, they do not reduce inductances sufficiently to enable fabrication of all desired SFQ circuits.

A conventional SNS edge Josephson junction used in fabrication of SFQ digital circuits is illustrated in FIG. 1. The SNS edge Josephson junction is formed on substrate 101, which may typically have a thickness in the range of 5–40 mils and which may typically be NdGaO$_3$, LaAlO$_3$, SrTiO$_3$, (ZrO$_2$)$_{1-x}$(Y$_2$O$_3$)$_x$(cubic zirconia), or MgO. A first superconductor layer is formed on an upper planar surface of substrate 101. The first superconductor layer 103 may typically be a YBa$_2$Cu$_3$O$_{7-\delta}$ (YBCO) thin film layer or the like having a thickness d in the range of 0.05–0.5 $\mu$m. First superconductor layer 103 and insulator layer 105 are deposited sequentially upon the entire surface of the device and then both layers are patterned together to produce a self-aligned edge 107, as illustrated. Insulator layer 105 may typically have a thickness of 500–3,000 Å and may typically be SrTiO$_3$ or Sr$_2$AlTaO$_6$. Superconductor layer 103 serves as a base electrode of the device.

Counter electrode 109 and the corresponding interconnect of the counter electrode are subsequently formed on the device by firstly depositing a normal-metal layer 111 such as PrBaCuO$_3$(PRBCO) or the like upon the entire upper planar surface of the device. The normal-metal layer 111 typically may have a thickness a of 1/100 microns. A second superconductor layer 113 which may typically be YBCO having thickness b of 0.1–0.3 $\mu$m is thereafter deposited on normal-layer 111. The second superconductor layer 113 and the normal-metal layer 111 are thereafter patterned using typical known removal techniques to form counter electrode 109 and the corresponding interconnect leading to edge 107. The active area of the SNS edge Josephson junction is in the vicinity of the edge 107 where normal-metal layer 111 is sandwiched directly between respective first and second superconductor layers 103 and 113.

The active area of the SNS edge Josephson junction as illustrated in FIG. 1 is determined by the width w of the interconnect portion of counter electrode 109 and the thickness d of first superconductor layer 103. One of the advantages of this device is that the counter electrode serves as an interconnect wiring layer. However, a problem with this design approach is that the narrow strip interconnect portion of the counter electrode 109 having width w has a relatively large inductance. A counter electrode of this conventional design including a ground plane may typically contribute at least approximately 1 pH of inductance along the interconnect between the large counter electrode area and the active area of the device and may contribute even greater inductance if a ground plane is not included.

In principle, this stray or parasitic inductance of the edge junction and the wiring to the device can be reduced by forming a wider counter electrode interconnect. However, since the counter electrode interconnect width w also determines the active area of the device, which in turn determines the critical current for a given normal-metal thickness, the width of the counter electrode interconnect cannot be arbitrarily increased. Theoretically, the critical current density $J_c$ of the device is given as:

$$J_c = I_c/A = I_c/wd \tag{1}$$

where w is the junction width in the active area and d is the base electrode film thickness. Through experimentation, it has been determined that the current density $J_c$ of the device must be greater than $10^5$ A/cm$^2$ to achieve acceptable values of the critical current-normal state resistance product ($I_cR_n$) greater than 300 $\mu$V. However, since YBCO film thickness must also be greater than 2000 Å to achieve low inductances, and since the above described junction critical current must be approximately 50 $\mu$A, the counter electrode width is constrained to approximately 2.5 microns or less.

These above-noted requirements must be maintained to enable the SNS edge Josephson junction to have an acceptable operating speed. Accordingly, the width w of the counter electrode, which is equivalent to the width of the junction in the active area as illustrated in FIG. 1, is limited, thus inherently adversely contributing to stray inductance.

SUMMARY OF THE INVENTION

Accordingly, it is a primary object of the present invention to provide low inductance HTS interconnects and Josephson junctions.

The above object is fulfilled by providing an SNS edge Josephson junction including a substrate;

a first superconductor layer deposited on a planar surface of the substrate;

an insulating layer deposited on the first superconducting layer, the first superconductor layer and the insulating layer being patterned together such that an edge of the first superconductor layer is exposed;

a slot insulator deposited on the edge of the first superconductor layer, the slot insulator including a slot of predetermined width through which the first superconductor layer is exposed;

a normal layer deposited on the edge of the first superconductor layer through the slot of the slot insulator, the normal layer overlapping onto the slot insulator; and a second superconductor layer formed on the normal layer.

The object of the present invention may also be fulfilled by providing a method of making an SNS edge Josephson junction including the steps of forming a first superconductor layer on a planar surface of a substrate;

forming an insulating layer on the first superconductor layer;

patterning the first superconductor layer and the insulating layer together to expose an edge of the first superconductor layer;

forming a slot insulator on the edge of the first superconductor layer, the slot insulator having a slot of predetermined width through which the first superconductor layer is exposed;

forming a normal layer on the edge of the first superconductor layer through the slot of the slot insulator, the normal layer overlapping onto the slot insulator; and forming a second superconductor layer on the normal layer.

Since the width of the interconnect of the counter electrode in the active area of the device, or in other words, the junction itself, is limited by the slot insulator, the width of a counter electrode interconnect can be increased. Since the width of the interconnect can be increased while maintaining optimum junction width, stray inductance can be greatly reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DETAILED DESCRIPTION OF THE PREFERRED EMBODIMENTS

FIGS. 2–6 illustrate perspective and cross-sectional views of a preferred embodiment of the present invention. Like elements are denoted similarly throughout FIGS. 2–6. It is to be understood that the particular shape, materials and dimensions are given by way of illustration and are not to be considered as limiting.

An object of the present invention is to reduce stray inductance to provide low inductance HTS interconnects and Josephson junctions. This object is achieved by the inventive technique which enables counter electrode width to be increased, to thus reduce stray inductance, while maintaining optimum junction area requirements needed to obtain acceptable values of critical current $I_c$ and normal state resistance $R_n$. The objects of the present invention are achieved by using a slotted insulator to limit the edge contact area of a wide counter electrode, as described hereinafter.

Figure 1:
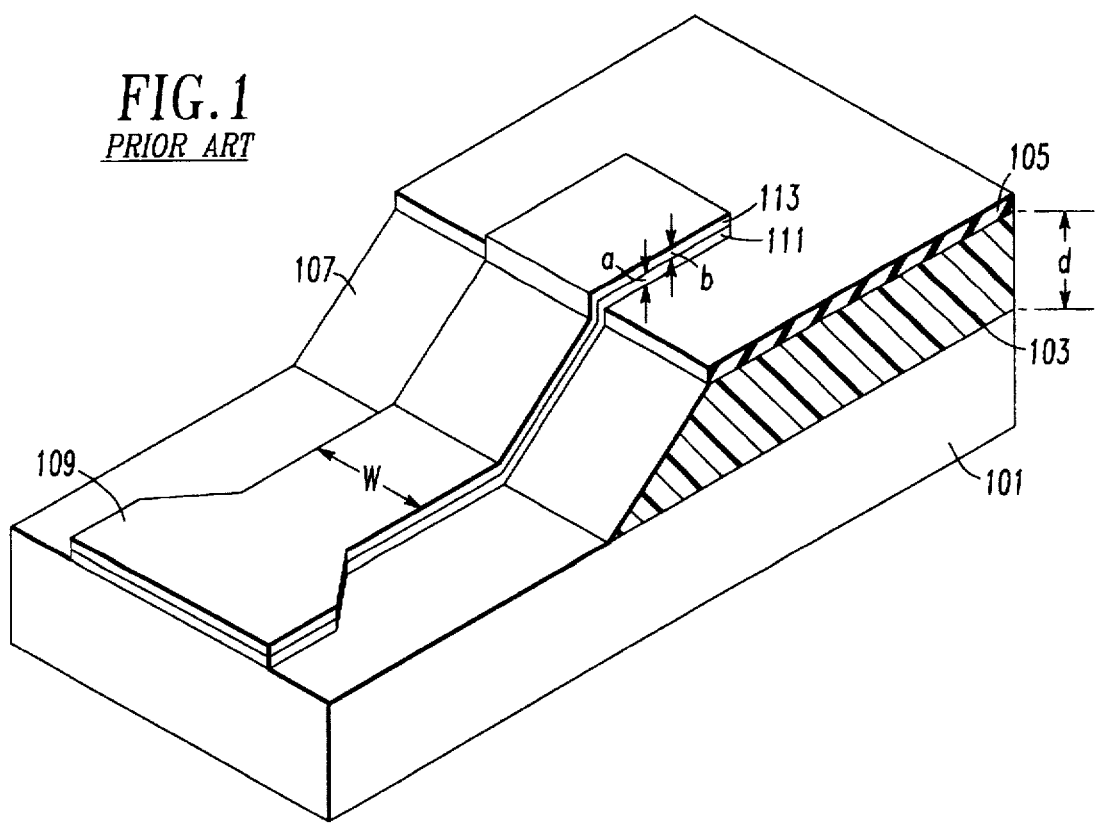
FIG. 1 is a perspective view of a conventional SNS edge Josephson junction.
Figure 2:
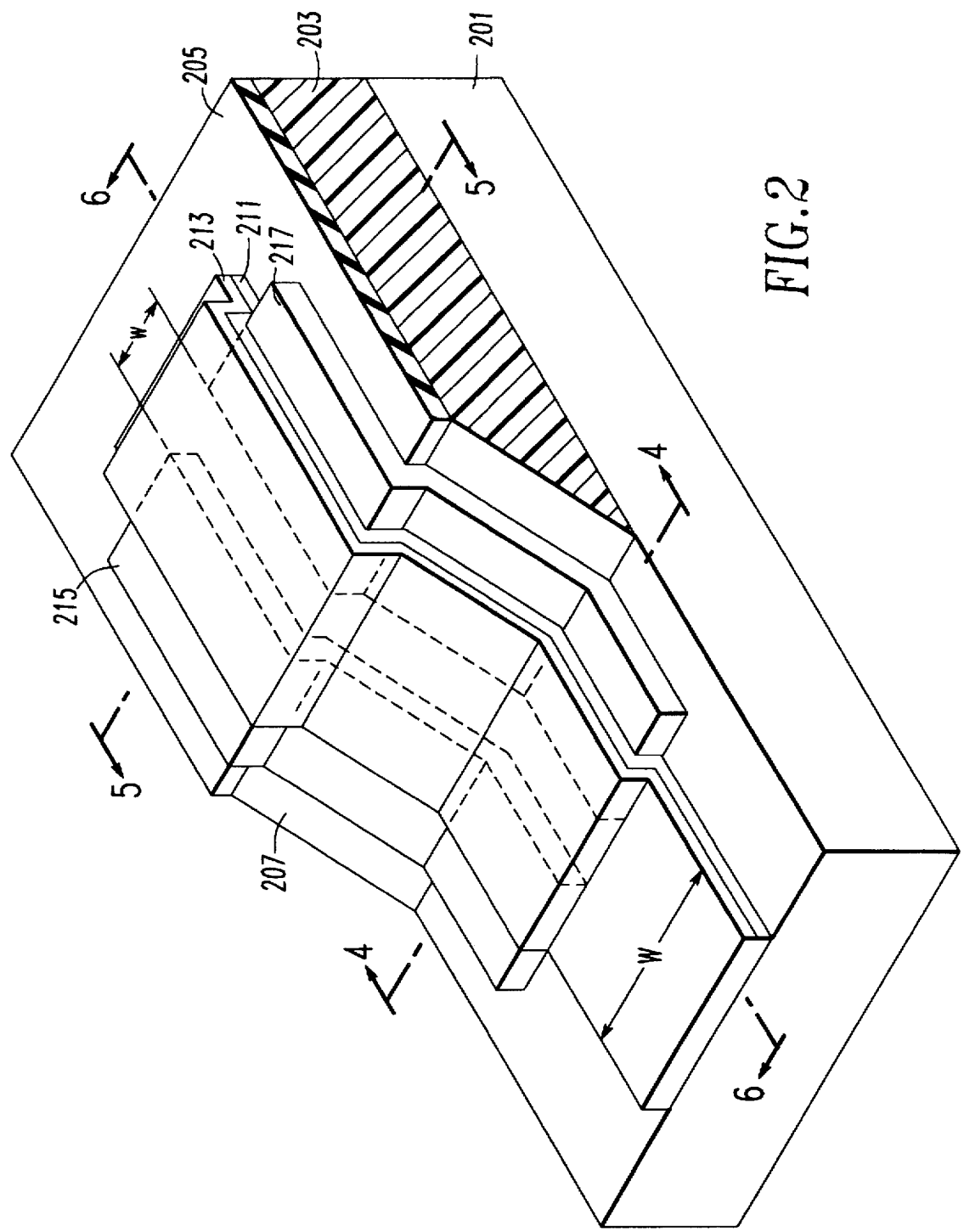
FIG. 2 is a perspective view of an SNS edge Josephson junction of an embodiment of the present application which includes a slot insulator.

FIG. 2 illustrates an SNS edge Josephson junction of a preferred embodiment of the present application comprising substrate 201, first superconductor layer 203 which may be YBCO or the like and insulator 205 as described previously with respect to FIG. 1. As described above with respect to FIG. 1, first superconductor layer 203 is deposited upon the entire upper planar surface of substrate 201 using known techniques. Thereafter, insulator layer 205 is deposited on superconductor layer 203. Subsequently, first superconductor layer 203 and insulator layer 205 are selectively patterned together to form self-aligned edge portion 207.

Figure 3:
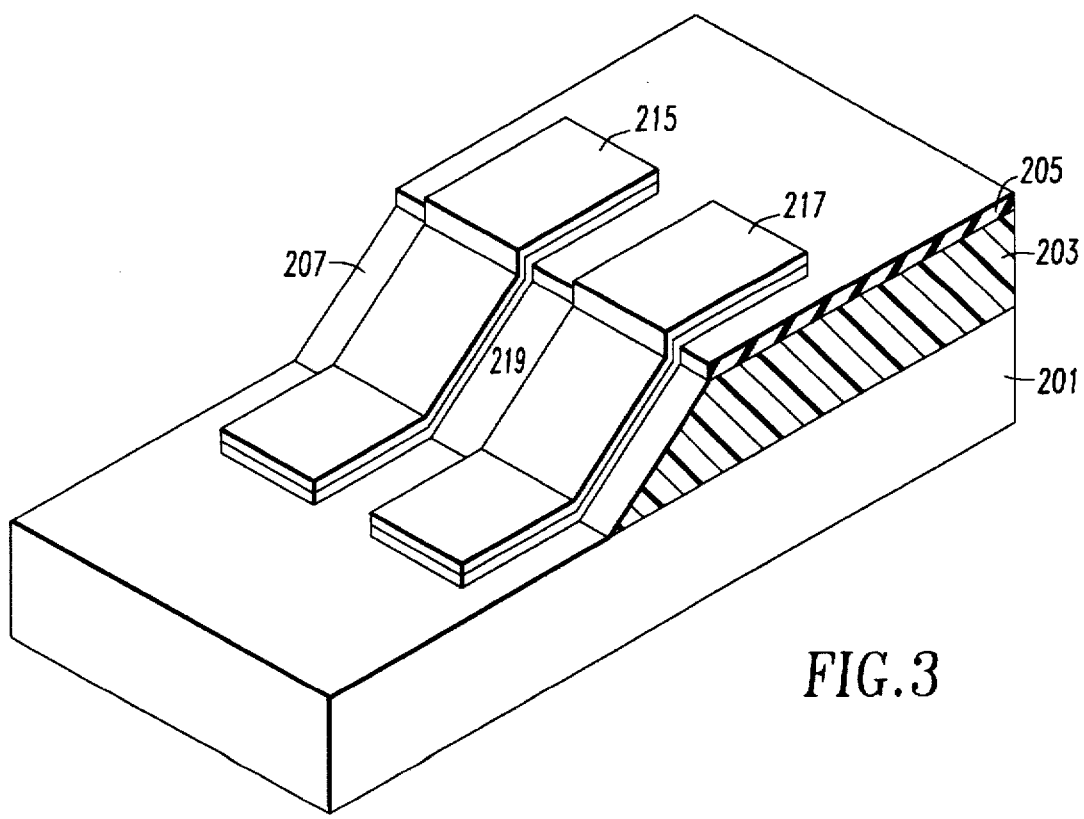
FIG. 3 is a perspective view of the SNS edge Josephson junction of the FIG. 2 embodiment including the slot insulator prior to formation of the normal-metal layer and the second superconductor layer.

Thereafter, an additional insulating layer is deposited upon the device over edge 207 of first superconductor layer 203. The additional insulating layer overlaps on insulator layer 205 above the edge. In a preferred embodiment, the additional insulating layer may be $SrTiO_3$ having a thickness of 500 Å and insulator layer 205 may be $SrTiO_3$ having a thickness in the range of 500–3000 Å, or preferably a thickness of 1500 Å. Both of these layers may be epitaxial $SrTiO_3$ layers deposited by off-axis sputtering. The additional insulating layer formed on edge 207 is selectively patterned to form slot insulators 215 and 217. FIG. 3 illustrates slot insulators 215 and 217 as patterned on the device prior to formation of the normal-metal layer and the second superconductor layer thereon. As can be readily understood from FIG. 3, the additional insulating layer is patterned such that slot 219 exists between slot insulators 215 and 217. As illustrated, the additional insulating layer is removed between slot insulators 215 and 217 so that slot 219 on edge 207 defines the active area of the device. In a preferred embodiment, slot insulators 215 and 217 may be patterned using AZ 1518 photoresist reflowed for five minutes at 130° C. followed by an Ar ion mill at 150 eV and 20° from normal incidence.

Subsequent to patterning of the additional insulating layer into slot insulators 215 and 217 to form slot 219 through which edge 207 of first superconductor layer 203 is exposed, a normal-metal layer 211 such as $PrBa_2Cu_3O_{7-\delta}$ (PBCO), cobalt doped $YBa_2Cu_{3-x}Co_xO_{7-\delta}$ (YBCO) or calcium doped $Y_{1-x}Ca_xBa_2Cu_3O_7$ is formed on the entire upper surface of the device. Thereafter, second superconductor layer 213 which may be YBCO is deposited on normal-metal layer 211. The normal-metal layer 211 and the second superconductor layer 213 are thereafter patterned to form a counter electrode.

Figure 4:
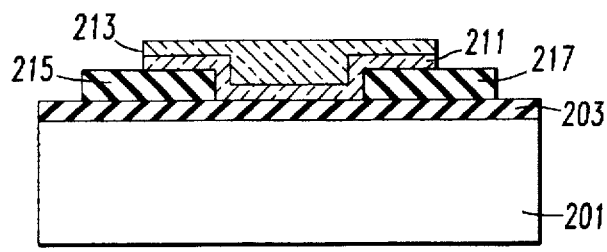
FIG. 4 is a cross-sectional view of the SNS edge Josephson junction of the FIG. 2 embodiment taken along line 4—4.

FIG. 4 is a cross-sectional view of the SNS edge Josephson junction of the FIG. 2 embodiment taken along line 4—4. The SNS junction, or the active area of the junction, is realized where normal-metal layer 211 is directly sandwiched respectively between first and second superconductor layers 203 and 213. The SNS junction is realized within edge portion 207 where insulator layer 205 has been removed. As previously described, first superconductor layer 203 serves as a base electrode and second superconductor layer 213 serves as a counter electrode. It is to be understood that FIGS. 4-6 in general are illustrative only and are not drawn to scale. In particular, film thicknesses are exaggerated to emphasize the edge portion. For example, the thicknesses of first and second superconductor layers 203 and 213 are relatively similar as specified previously.

Figure 5:
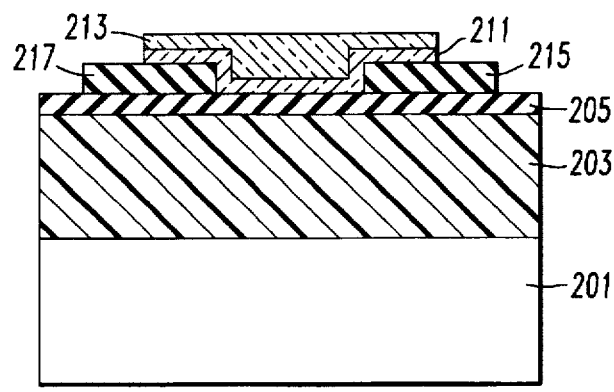
FIG. 5 is a cross-sectional view of the SNS edge Josephson junction of the FIG. 2 embodiment taken along line 5—5.

FIG. 5 is a perspective view of the SNS edge Josephson junction of the FIG. 2 embodiment taken along line 5—5. Since this cross-sectional view is taken along line 5—5, first superconductor layer 203 has a greater thickness than in the FIG. 4 embodiment. Also, since this cross-sectional view is not within edge 207, insulator layer 205 is illustrated as disposed on first superconductor layer 203. Although slot insulators 215 and 217 are illustrated as disposed on insulator layer 205 and as having normal-metal layer 211 and second superconductor layer 213 thereon, the device is inactive along this particular cross-section since normal-metal layer 211 is not directly sandwiched respectively between first and second superconductor layers 203 and 213.

Figure 6:
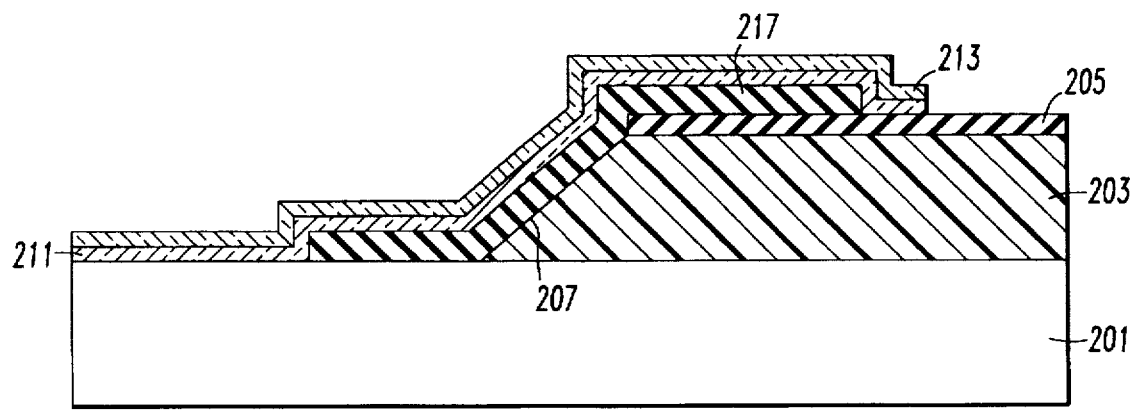
FIG. 6 is a cross-sectional view of the SNS edge Josephson junction of the FIG. 2 embodiment taken along line 6—6.

FIG. 6 is a cross-sectional view of the SNS edge Josephson junction of the FIG. 2 embodiment taken along line 6—6. Insulator layer 205 is illustrated as disposed on the non-edge portion of first superconductor layer 203 above the edge. Slot insulator 217 is illustrated as disposed along edge 207 of the first superconductor layer 203 and as overlapping onto insulator layer 205 above the edge. Normal-metal layer 211 is illustrated as disposed along both areas of insulator layer 205 and normal-metal layer 211. Second superconductor layer 213 is illustrated as disposed on normal-metal layer 211. Along this particular cross-section, the device is inactive since normal-metal layer 211 is not directly sandwiched respectively between first and second superconductor layers 203 and 213.

As can be readily understood in view of FIG. 2, in the preferred embodiment an optimum junction width w between slot insulators 215 and 217 can be maintained while width W of counter electrode 209 can be increased since slot insulators 215 and 217 effectively limit junction width w along edge 207 of first superconductor layer 203. Since slot insulators 215 and 217 limit junction width w, the width of counter electrode 209 may be increased so that the current flowing through counter electrode 209 may be spread out to a greater extent than in the FIG. 1 conventional SNS edge Josephson junction. In a preferred embodiment of the present application, the counter electrode of FIG. 2 may have a width of substantially W=10 microns and the junction width along slot 219 between slot insulators 215 and 217 may be substantially w=3 microns.

It is to be understood that the preferred embodiment of the present application is not to be limited to the embodiments as described above with respect to FIGS. 2-6. Various patterning and deposition techniques may be used as would be understood by one of ordinary skill. With regard to the insulator layers, any particular insulator may be used provided that the insulator be a high quality epitaxial insulator with a reasonably low dielectric constant. It is to be understood that patterning of the insulator is critical since the slot edges must be tapered to minimize nucleation of grain boundaries in the counter electrode. At the same time, the patterning process must also be capable of producing narrow slots over the base electrode edge. As described previously, in a preferred embodiment, epitaxial $SrTiO_3$ insulator layers may be deposited by off-axis sputtering. It is to be understood that various insulator layers may be used and deposited by various techniques which fulfill the above-noted requirements. For example, in an additional preferred embodiment, an insulator having a lower dielectric constant such as $Sr_2AlTaO_6$ may be used.

In the preferred embodiment, stray inductance along the counter electrode/interconnect of the SNS edge Josephson junction is reduced. The SNS edge Josephson junction of the preferred embodiment having a slot-defined junction without a ground plane exhibits excellent performance comparable to SNS edge Josephson junctions having similar active junction dimensions without slots. As an extension of the preferred embodiment, slot-defined edge junctions and SQUIDs can be integrated with ground planes such that junction, interconnect and total SQUID inductance can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An SNS edge Josephson junction comprising:
   a substrate;
   a first superconductor layer deposited on a planar surface of said substrate;
   an insulating layer deposited on said first superconducting layer,
   said first superconductor layer and said insulating layer being patterned together such that an edge of said first superconductor layer is exposed;
   a slot insulator deposited on the edge of said first superconducting layer, said slot insulator including a slot of predetermined width through which said first superconductor layer is exposed;
   a normal layer deposited on the edge of said first superconductor layer through the slot of said slot insulator, said normal layer overlapping on said slot insulator; and
   a second superconductor layer formed on said normal layer.

2. The SNS edge Josephson junction of claim 1, wherein said normal layer and said second superconductor layer both have a second predetermined width which is greater than the predetermined width of the slot.

3. The SNS edge Josephson junction of claim 2, wherein the second predetermined width is substantially 10 μm and the predetermined width is substantially 3 μm.

4. The SNS edge Josephson junction of claim 1, wherein said first and second superconductor layers comprise $YBa_2Cu_3O_7$ thin film.

5. The SNS edge Josephson junction of claim 1, wherein said insulating layer and said slot insulator comprise $SrTiO_3$.

6. The SNS edge Josephson junction of claim 1, wherein said insulating layer and said slot insulator comprise $Sr_2AlTaO_6$.

7. The SNS edge Josephson junction of claim 1, wherein said normal layer comprises $YBa_2Cu_{3-x}O_7$.

8. The SNS edge Josephson junction of claim 1, wherein said normal layer comprises $Y_{1-x}Ca_xBa_2Cu_3O_7$.

9. The SNS edge Josephson junction of claim 1, wherein said normal layer comprises Pr doped $YBa_2Cu_3O_7$.

10. The SNS edge Josephson junction of claim 1, wherein said second superconductor layer is a counter electrode and said first superconductor layer is a base.

* * * * *